(12) United States Patent
Umezawa et al.

(10) Patent No.: US 8,420,216 B2
(45) Date of Patent: Apr. 16, 2013

(54) THERMOSETTING RESIN COMPOSITION

(75) Inventors: Tomokazu Umezawa, Minato-ku (JP); Tetsuo Wada, Minato-ku (JP); Hirofumi Inoue, Minato-ku (JP)

(73) Assignee: Showa Denko K.K., Tokyo (JP)

( * ) Notice: Subject to any disclaimer, the term of this patent is extended or adjusted under 35 U.S.C. 154(b) by 422 days.

(21) Appl. No.: 12/669,416

(22) PCT Filed: Jul. 11, 2008

(86) PCT No.: PCT/JP2008/062572
§ 371 (c)(1),
(2), (4) Date: Jan. 15, 2010

(87) PCT Pub. No.: WO2009/011304
PCT Pub. Date: Jan. 22, 2009

(65) Prior Publication Data
US 2010/0186996 A1     Jul. 29, 2010

(30) Foreign Application Priority Data
Jul. 18, 2007  (JP) ................................. 2007-187123

(51) Int. Cl.
*B32B 27/40* (2006.01)
*H05K 1/02* (2006.01)
*C08L 75/04* (2006.01)

(52) U.S. Cl.
USPC ................. 428/423.1; 428/425.8; 428/425.9; 174/254; 174/258; 525/452

(58) Field of Classification Search ........... 174/258, 174/254; 525/452, 453; 428/423.1, 423.5, 428/425.8, 425.9
See application file for complete search history.

(56) References Cited

U.S. PATENT DOCUMENTS

| 4,801,623 | A * | 1/1989 | Hess et al. ..................... 521/157 |
| 2004/0067440 | A1 | 4/2004 | Minegishi et al. |
| 2005/0239990 | A1* | 10/2005 | Higuchi et al. .................. 528/44 |
| 2005/0288430 | A1* | 12/2005 | Gindin et al. .................. 524/589 |
| 2007/0293636 | A1 | 12/2007 | Kimura et al. |
| 2008/0188625 | A1 | 8/2008 | Uchida et al. |
| 2009/0054577 | A1* | 2/2009 | Uchida et al. .................. 524/423 |
| 2009/0133905 | A1 | 5/2009 | Kimura et al. |

FOREIGN PATENT DOCUMENTS

| JP | 10226745 A | 8/1998 |
| JP | 10231412 A | 9/1998 |
| JP | 10330460 A | 12/1998 |
| JP | 11349666 A | 12/1999 |
| JP | 2003013031 A | 1/2003 |
| JP | 2003183401 A | 7/2003 |
| JP | 2004045792 A | 2/2004 |
| JP | 2004359729 A | 12/2004 |
| JP | 2005298613 A | 10/2005 |
| JP | 2006117922 A | 5/2006 |
| JP | 2006124681 A | 5/2006 |
| JP | 2006274258 A | 10/2006 |
| JP | 2007100038 A | 4/2007 |
| JP | 2007177161 A * | 7/2007 |
| WO | 02077058 A1 | 10/2002 |
| WO | 2007032463 A1 | 3/2007 |

OTHER PUBLICATIONS

Edited by The Japan Society of Epoxy Resin Technology Soritsu 30 Shunen Kinen Shuppan Henshu Iinkai, Sosetsu Epoxy Resin Kiso Hen I, 1st edition, The Japan Society of Epoxy Resin Technology, Nov. 19, 2003, pp. 150 to 152.
Chinese Office Action dated Aug. 10, 2011 issued in Application No. 200880021511.4.

\* cited by examiner

*Primary Examiner* — Thao T. Tran
(74) *Attorney, Agent, or Firm* — Sughrue Mion, PLLC

(57) ABSTRACT

The thermosetting resin composition according to the present invention includes a resin (A) containing two or more carboxyl groups and having a polyurethane structure, a strongly basic nitrogen-containing heterocyclic compound having pKa of 10.0 to 14.0 as a curing accelerator (B) and a curing agent (C). A cured product of the thermosetting resin composition is used as an insulating protective film for printed wiring boards, flexible printed wiring boards, chip-on-films, etc. The thermosetting resin composition of the invention has improved low-temperature curability and instantaneous curability, can realize tack-free property, can simultaneously realize low warpage property and electrical insulation property, does not contaminate a curing oven and the like by outgassing during heating, has a sufficient pot life, can form excellent cured products and insulating protective films, and can form solder resists and insulating protective films at low cost with good productivity.

11 Claims, No Drawings

THERMOSETTING RESIN COMPOSITION

TECHNICAL FIELD

The present invention relates to a thermosetting resin composition, and relates to a thermosetting resin composition comprising a resin containing two or more carboxyl groups and having a polyurethane structure, a strongly basic nitrogen-containing heterocyclic compound having pKa of 10.0 to 14.0 as a curing accelerator and a curing agent, a cured product of the composition and uses of the cured product. More particularly, the invention relates to a thermosetting resin composition which is tack-free, is excellent in low-temperature curability, flexibility and electrical insulation property and can be favorably utilized for protective films such as solder resists and layer insulating films, electrical insulating materials, sealing materials of IC and ultra LSI, and laminates, and to a cured product of the composition and uses of the cured product.

BACKGROUND ART

In conventional thermosetting type solder resist inks, curing accelerators, such as imidazoles, phosphonium salts and melamine-based compounds, have been used, as disclosed in Japanese Patent Laid-Open Publication No. 117922/2006 (patent document 1) and Japanese Patent Laid-Open Publication No. 298613/2005 (patent document 2). In recent years, improvement of low-temperature curability and instantaneous curability has been required for the solder resist inks because the heat-curing process has been shortened by the pursuit of cost down by the users or under the influences of relaxation of the heating conditions. In addition, tack-free property, low warpage property, electrical insulation property and a property that the solder resist inks do not contaminate a curing oven and the like to the last by outgassing due to heating have been also required.

The above compounds hitherto used, however, are insufficient in both of low-temperature curability and instantaneous curability, and tack-free property cannot be realized for shortage of cure. If the amount of the curing accelerator is increased for the purpose of improving them, enhancement of low-temperature curability, enhancement of instantaneous curability and tack-free property can be realized. However, because the curing reaction proceeds excessively, a pot life after blending of the components cannot be sufficiently ensured, resulting in a problem that the working life is shortened. Further, if the amount of the curing accelerator is increased, there are brought about a bad effect that low warpage property of a cured product cannot be ensured, a bad effect that the electrical insulation property is lowered by the excess curing accelerator and a bad effect that outgassing is caused by heating the excess curing accelerator and by the outgassing a curing oven and the like are contaminated.

The thermosetting type solder resist inks and the like are used for printed wiring boards, flexible printed wiring boards, chip-on-films (COF), etc. In the case of, for example, chip-on-films (COF), the number of pins of a chip such as IC or LSI is increased as the resolution of an image is heightened, and with increase of the number of pins, the distance between wirings of a substrate as a driver for driving tends to be decreased more and more. On this account, enhancement of reliability of electrical insulation between wirings has been demanded more than before. Chip-on-films (COF) having a pitch of 35 to 40 μm (total of wiring width and distance between wirings) have been mass-produced now, but introduction of design of 30 μm pitch or 25 μm pitch in future is planned, and enhancement of reliability of electrical insulation between wirings has become an essential problem.

The chip-on-films (COF) also play a role of joining an image plane of a liquid crystal or the like to a rigid printed wiring board for controlling the image plane. In the case where the chip-on-film (COF) is laminated onto them, the demand for low warpage property of the chip-on-film (COF) has become stronger and stronger in order to raise alignment accuracy. Also in the case where IC, LSI or the like is mounted on a substrate, alignment accuracy is important, and low warpage property has been likewise demanded.

In the production of chip-on-films (COF), a flexible base is stored in the form of a wound tape in order to efficiently carry out mass production, and with unwinding the flexible base, steps of wiring formation by etching, tin plating treatment, application and heat curing of a solder resist ink, quality inspection, etc. are carried out. If the surface of an insulating protective film has tackiness, unwinding of the tape becomes difficult in the step subsequent to the film formation step, specifically the quality inspection step, and this is disadvantageous in working. Further, a tape whose quality inspection has finished is also stored in such a state that the tape is wound around a reel, and the tape is shipped to the maker who mounts IC, LSI or the like on the tape. If the insulating protective film has tackiness, tapes adhere to each other during storage before shipment, and when the tape is unwound by the maker for mounting, disadvantages occur.

In the case of the chip-on-films (COF), tinplating is carried out on the wiring frequently. It is known that if the tin plating layer is exposed to a temperature of not lower than 130° C., tin undergoes migration in the depth direction of the copper wiring, and the tin plating layer becomes thin. In the case where a joining method in which a gold-tin eutectic crystal is formed between a gold plating layer provided on the terminal of IC, LSI or the like and a tin plating layer provided on the copper wiring is adopted in the mounting of IC, LSI or the like, the eutectic crystal is not sufficiently formed to thereby bring about joining failure when the tin plating layer is thin, and therefore, curing at 150° C. that is a curing temperature of a thermosetting resin used for usual solder resists cannot be carried out.

Patent document 1: Japanese Patent Laid-Open Publication No. 117922/2006

Patent document 2: Japanese Patent Laid-Open Publication No. 298613/2005

DISCLOSURE OF THE INVENTION

Problem to be Solved by the Invention

The present invention is intended to solve the above problems associated with the prior art, and it is an object of the invention to provide a thermosetting resin composition which is excellent in low-temperature curability, instantaneous curability, tack-free property, low warpage property and electrical insulation property, does not contaminate a curing oven and the like by outgassing during heating and can ensure a satisfactory pot life, a cured product composed of the composition and uses of the cured product.

Means to Solve the Problem

In order to solve the above problems, the present inventors have earnestly studied. As a result, they have found that the above problems can be solved by a thermosetting resin composition comprising a resin containing two or more carboxyl groups and having a polyurethane structure, a strongly basic nitrogen-containing heterocyclic compound having pKa of 10.0 to 14.0 as a curing accelerator and a curing agent, and they have accomplished the present invention. That is to say, the present invention relates to the following matters.

[1] A thermosetting resin composition comprising a resin (A) containing two or more carboxyl groups and having a polyurethane structure, a strongly basic nitrogen-containing heterocyclic compound having pKa of 10.0 to 14.0 as a curing accelerator (B), and a curing agent (C).

[2] The thermosetting resin composition as stated in [1], wherein the curing accelerator (B) is a compound which has a boiling point of not lower than 100° C. and is liquid at 20° C.

[3] The thermosetting resin composition as stated in [1], wherein the curing accelerator (B) is 1,8-diazabicyclo[5.4.0]undecene-7 and/or 5-diazabicyclo[4.3.0]nonene-5.

[4] The thermosetting resin composition as stated in any one of [1] to [3], wherein the resin (A) containing two or more carboxyl groups and having a polyurethane structure is obtained by allowing a polyisocyanate compound a, a polyol compound b (except compound c) and a carboxyl group-containing dihydroxy compound c to react with one another.

[5] The thermosetting resin composition as stated in [4], wherein the resin (A) containing two or more carboxyl groups and having a polyurethane structure is obtained by allowing the compounds a, b and c, and a monohydroxy compound d and/or a monoisocyanate compound e to react with one another.

[6] The thermosetting resin composition as stated in any one of [1] to [5], wherein the curing agent (C) is a compound having an epoxy group which reacts with a carboxyl group.

[7] A solder resist ink containing the thermosetting resin composition as stated in any one of [1] to [6].

[8] A cured product obtained by curing the thermosetting resin composition as stated in any one of [1] to [6].

[9] An insulating protective film comprising the cured product as stated in [8].

[10] A solder resist comprising the cured product as stated in [8].

[11] A printed wiring board having a substrate whose surface is provided with a metal wiring and the insulating protective film as stated in [9] which covers a part or all of the substrate surface.

[12] A flexible printed wiring board having a substrate whose surface is provided with a metal wiring and the insulating protective film as stated in [9] which covers a part or all of the substrate surface.

[13] A chip-on-film (COF) having a substrate whose surface is provided with a metal wiring and the insulating protective film as stated in [9] which covers a part or all of the substrate surface.

[14] An electronic part containing the cured product as stated in [8].

EFFECT OF THE INVENTION

Conventional solder resist inks are insufficient in instantaneous curability and low-temperature curability, and because of shortage of cure, it is difficult to realize tack-free property. In contrast with this, according to the thermosetting resin composition of the invention, low-temperature curability and instantaneous curability are improved, tack-free property can be realized, and enhancement of low warpage property and electrical insulation property which have a trade-off relationship to the above properties can be also realized at the same time. According to the thermosetting resin composition of the invention, further, a curing oven and the like are not contaminated by outgassing during heating, a satisfactory pot life can be ensured, excellent cured products and insulating protective films can be formed, and solder resists, insulating protective films, etc. can be formed at low cost with good productivity. Moreover, by using them for printed wiring boards, flexible printed wiring boards, chip-on-films (COF) and the like, electronic parts to which excellent properties have been imparted can be supplied.

BEST MODE FOR CARRYING OUT THE INVENTION

The thermosetting resin composition of the invention is described in detail hereinafter.

The thermosetting resin composition of the invention comprises a resin (A) containing two or more carboxyl groups and having a polyurethane structure (sometimes referred to as a "polyurethane resin (A)" hereinafter), a strongly basic nitrogen-containing heterocyclic compound having pKa of 10.0 to 14.0 as a curing accelerator (B) and a curing agent (C), and may further comprise an additive (D) and an organic solvent (E) when needed. The components to constitute the thermosetting resin composition of the invention are described below.

Resin (A) Containing Two or More Carboxyl Groups and Having Polyurethane Structure The polyurethane resin (A) has two or more carboxyl groups in one molecule and has a urethane bond formed by the reaction of a polyisocyanate compound with a polyol compound. Such a polyurethane resin (A) can be synthesized by, for example, allowing a polyisocyanate compound (a), a polyol compound (b) and a carboxyl group-containing dihydroxy compound (c) to react with one another. In the reaction, a monohydroxy compound (d) and/or a monoisocyanate compound (e) may be added as end cappers.

Examples of the polyisocyanate compounds (a) include diisocyanates, such as 2,4-tolylene diisocyanate, 2,6-tolylene diisocyanate, isophorone diisocyanate, 1,6-hexamethylene diisocyanate, 1,3-trimethylene diisocyanate, 1,4-tetramethylene diisocyanate, 2,2,4-trimethylhexamethylene diisocyanate, 2,4,4-trimethylhexamethylene diisocyanate, 1,9-nonamethylene diisocyanate, 1,10-decamethylene diisocyanate, 1,4-cyclohexane diisocyanate, 2,2'-diethyl ether diisocyanate, diphenylmethane-4,4'-diisocyanate, (o, m or p)-xylene diisocyanate, methylenebis(cyclohexyl isocyanate), cyclohexane-1,3-dimethylene diisocyanate, cyclohexane-1,4-dimethylene diisocyanate, 1,5-naphthalene diisocyanate, p-phenylene diisocyanate, 3,3'-methyleneditolylene-4,4'-diisocyanate, 4,4'-diphenyl ether diisocyanate, tetrachlorophenylene diisocyanate, norbornane diisocyanate and hydrogenated (1,3- or 1,4-)xylylene diisocyanate. These may be used singly or may be used in combination of two or more kinds.

Examples of the polyol compounds (b) (except compound (c)) include low-molecular weight diol, polycarbonate diol, polyether diol, polybutadiene having been hydroxyl-terminated at both ends, and polyester diol. These may be used singly or may be used in combination of two or more kinds. Of these, polycarbonate diol is preferably used from the viewpoints of flexibility, electrical properties and heat resistance.

Examples of the carboxyl group-containing dihydroxy compounds (c) include 2,2-dimethylolpropionic acid, 2,2-dimethylolbutanoic acid, N,N-bishydroxyethylglycine and N,N-bishydroxyethylalanine. These may be used singly or may be used in combination of two or more kinds. Of these, 2,2-dimethylolpropionic acid and 2,2-bisdimethylbutanoic acid are preferable from the viewpoint of solubility in solvents.

Examples of the monohydroxy compounds (d) include 2-hydroxyethyl (meth)acrylate, hydroxypropyl (meth)acrylate, hydroxybutyl (meth)acrylate, cyclohexanedimethanol mono (meth)acrylate, caprolactone or alkylene oxide addition products of these (meth)acrylates, glycerol di(meth)acrylate, trimethylol di(meth)acrylate, pentaerythritol tri (meth)acrylate, dipentaerythritol penta(meth)acrylate, ditrimethylolpropane tri(meth)acrylate, allyl alcohol, allyloxyethanol, glycolic acid, hydroxypivalic acid, methanol, ethanol, n-propanol, isopropanol, n-butanol, isobutanol, sec-butanol, t-butanol, amyl alcohol, hexyl alcohol and octyl alcohol. These may be used singly or may be used in combination of two or more kinds.

Examples of the monoisocyanate compounds (e) include (meth)acryloyloxyethyl isocyanate, phenyl isocyanate, hexyl isocyanate and dodecyl isocyanate. These may be used singly or may be used in combination of two or more kinds.

The number-average molecular weight of the polyurethane resin (A) is in the range of preferably 500 to 100,000, more preferably 8,000 to 30,000. The number-average molecular weight is a value in terms of polystyrene as measured by gel permeation chromatography (GPC). If the number-average molecular weight of the polyurethane resin (A) is less than the lower limit of the above range, elongation, flexibility and strength of the cured film are sometimes impaired. On the other hand, if the number-average molecular weight is more than the upper limit of the above range, there is a fear that the cured film becomes hard to thereby lower its flexibility.

The acid value of the polyurethane resin (A) is in the range of preferably 5 to 150 mgKOH/g, more preferably 30 to 120 mgKOH/g. If the acid value is less than the lower limit of the above range, density of crosslinkage formed by the reaction of the polyurethane resin (A) with other curable components is lowered to thereby sometimes impair heat resistance of the cured film, and the tack-free property is sometimes lowered. On the other hand, if the acid value is more than the upper limit of the above range, properties of the cured film as a solder resist, such as alkali resistance and electrical properties, are sometimes lowered, and low warpage property is frequently impaired. The acid value of the resin is a value as measured in accordance with JIS K5407.

The reason why the resin (A) containing two or more carboxyl groups and having a polyurethane structure is used in the thermosetting resin composition is that electrical insulation property, flexibility and low warpage property which are preferable as properties of a cured product obtained by the reaction with a curing agent can be realized and that because the carboxyl group is a group reactive to the curing agent and the resin (A) forms a salt together with the strongly basic nitrogen-containing heterocyclic compound, pH of the system is prevented from becoming strongly alkaline, so that when the thermosetting resin composition is used for a solder resist ink and the like, enhancement of storage stability of the ink becomes feasible. As the reason, it can be also mentioned that marked extension of a pot life at ordinary temperature after mixing of the resin (A) with the curing agent becomes feasible.

The resin (A) containing two or more carboxyl groups and having a polyurethane structure can be prepared in, for example, the following manner.

The polyol compound (b) and the carboxyl group-containing dihydroxy compound (c) are dissolved in a solvent, such as diethylene glycol ethyl ether acetate, then to the resulting solution is added the polyisocyanate compound (a), and they are allowed to react with each other at 80 to 160° C. for 2 to 24 hours. The amounts of the polyisocyanate compound (a), the polyol compound (b) and the carboxyl group-containing dihydroxy compound (c) used can be determined so that the molar ratio of the components, (a)/{(b)+(c)}, may become 0.8 to 1.2. When the monohydroxy compound (d) and/or the monoisocyanate compound (e) is used, the monohydroxy compound (d) and/or the monoisocyanagte compound (e) is added to the reaction solution after completion of the above reaction, and they are allowed to undergo reaction at 80 to 160° C. for 30 to 240 minutes. The monohydroxy compound (d) and/or the monoisocyanate compound (e) can be used in an amount of 0.1 to 5.0 parts by mass based on 100 parts by mass of the reaction solution prior to addition of the compound (d) and/or the compound (e).

Curing Accelerator (B)

As the curing accelerator (B) for use in the invention, a strongly basic nitrogen-containing heterocyclic compound having pKa of 10.0 to 14.0 is used, and the pKa is in the range of preferably 11.0 to 14.0, more preferably 12.0 to 13.5. If the pKa is less than 10.0, there occurs a disadvantage that tack-free property is not realized for shortage of cure of the cured product, so that such a pKa value is undesirable. If the pKa is more than 14.0, curing reaction proceeds even at low temperatures after the curing accelerator is mixed with a curing agent, and in the case where the composition is used for a solder resist ink and the like, a pot life is extremely shortened, so that such a pKa value is undesirable. Further, if the pKa is more than 14.0, storage stability of the solder resist ink at room temperature is deteriorated because of strong basicity of the curing accelerator, so that such a pKa value is undesirable.

The "pKa value" referred to in the invention is a numerical value represented by the following formula when the dissociation constant of an aqueous solution at 25° C. is denoted by "Ka". The dissociation constant Ka of the aqueous solution is determined by, for example, measuring a hydrogen ion concentration of the aqueous solution by a pH meter and calculating concentrations of a dissociated component and an undissociated component after dissolution by the use of the resulting hydrogen ion concentration and weighed values of the solvate and water before dissolution.

$$pKa = -\log_{10} Ka$$

From the viewpoint of non-contamination of a heating oven and the like, the curing accelerator (B) is preferably liquid at 20° C. that is ordinary temperature and has a boiling point of preferably not lower than 100° C., particularly preferably not lower than 150° C. If the boiling point is lower than 100° C., the curing accelerator (B) is scattered outside the cured product by heating, and the cured product does not acquire satisfactory curability occasionally.

In the case where the curing accelerator (B) is a compound which is solid at 20° C. that is ordinary temperature, a satisfactory curing rate cannot be obtained at a low curing temperature such as 110° C. or 120° C., and tack-free property cannot be realized. Therefore, it becomes necessary to carry out curing at a high temperature. In the case where the curing accelerator (B) is a compound which is solid at 20° C. that is ordinary temperature, further, there sometimes occurs a disadvantage that the catalyst scattered by sublimation or the like adheres to a curing oven, and its solid matter falls off and re-adheres to an electronic part, etc. to thereby contaminate them.

Examples of the curing accelerators (B) having such properties as above include piperidine, 1,8-diazabicyclo[5.4.0]undecene-7 (DBU) and 1,5-diazabicyclo[4.3.0]nonene-5

(DBN), and preferable are DBU (pKa: 12.5, boiling point: 240° C., liquid at 20° C.) and DBN (pKa: 12.7, boiling point: 200° C., liquid at 20° C.).

These curing accelerators have strong basicity, and by the addition of small amounts of them, instantaneous curability and low-temperature curability are obtained and tack-free property can be realized. By using such a strongly basic curing accelerator in combination with the aforesaid polyurethane resin (A), the strongly basic curing accelerator and the polyurethane resin (A) having an acid value form a salt bond. Therefore, the curing accelerator comes to be hardly released as a gas from the cured product by outgassing during heating, and contamination of a heating oven and the like can be inhibited. Moreover, even if the curing accelerator is released as a gas from the cured product by outgassing, the curing accelerator does not adhere to the curing oven as a solid matter such as a crystal because the curing accelerator is liquid at ordinary temperature, so that such a disadvantage that the solid matter falls off and re-adheres to an electronic part, etc. to thereby contaminate them does not occur.

Further, by using the curing accelerator (B), the amount of the curing accelerator added is decreased, and hence, low warpage property and electrical insulation property are enhanced.

As described above, by the use of the curing accelerator, an excellent thermosetting resin composition which is excellent in instantaneous curability, low-temperature curability, tack-free property, low warpage property and electrical insulation property and does not contaminate a curing oven and the like by outgassing during heating can be obtained.

The above curing accelerators (B) may be used singly or may be used in combination of two or more kinds. Although the amount of the curing accelerator (B) added is not specifically restricted, it is desired to be in the range of 0.01 to 2.0 parts by mass, preferably 0.1 to 2.0 parts by mass, more preferably 0.2 to 1.0 part by mass, based on 100 parts by mass of the polyurethane resin (A). If the amount of the curing accelerator (B) added is less than the lower limit of the above range, instantaneous curability and low-temperature curability are lowered, and with lowering of them, realization of tack-free property tends to become difficult. On the other hand, if the amount thereof is more than the upper limit of the above range, low warpage property tends to be deteriorated because the curing reaction proceeds excessively, and electrical insulation property tends to be lowered because of the curing accelerator remaining in a large amount in the cured product.

Furthermore, by using the strongly basic nitrogen-containing heterocyclic compound in combination with the resin (A) containing two or more carboxyl groups and having a polyurethane structure, these components form a salt, and therefore, pH of the system can be prevented from becoming strongly alkaline. On this account, when the composition is used for a solder resist ink and the like, enhancement of storage stability of the ink becomes feasible, and marked extension of a pot life at ordinary temperature after mixing with a curing agent becomes feasible. By previously mixing them to form a salt, strong basicity of the strongly basic nitrogen-containing heterocyclic compound can be decreased, and the risk of medical damages in the subsequent handling can be also decreased.

Curing Agent (C)

The curing agent (C) of the invention reacts with the polyurethane resin (A) and is bonded thereto to constitute a part of a cured product in the curing process. As the curing agent (C), an epoxy resin or the like which reacts with the polyurethane resin (A) is employable. Examples of such epoxy resins include epoxy compounds having two or more epoxy groups in one molecule, such as bisphenol A type epoxy resin, hydrogenated bisphenol A type epoxy resin, brominated bisphenol A type epoxy resin, bisphenol F type epoxy resin, novolak type epoxy resin, phenolic novolak type epoxy resin, cresol novolak type epoxy resin, N-glycidyl type epoxy resin, novolak type epoxy resin of bisphenol A, chelate type epoxy resin, glyoxal type epoxy resin, amino group-containing epoxy resin, rubber modified epoxy resin, dicyclopentadiene phenolic type epoxy resin, silicone modified epoxy resin and ε-caprolactone modified epoxy resin. Further, resins into the structures of which halogen atoms such as chlorine and bromine or atoms such as phosphorus have been introduced may be used in order to impart flame retardance. Moreover, bisphenol S type epoxy resin, diglycidyl phthalate resin, heterocyclic epoxy resin, bixylenol type epoxy resin, bisphenol type epoxy resin, tetraglycidyl xylenoyl ethane resin, etc. may be used as the curing agents (C).

In the thermosetting resin composition of the invention, the above curing agents (C) may be used singly or may be used in combination of two or more kinds. The amount of the curing agent (C) added is desired to be such an amount that the ratio of the epoxy equivalent of the curable component to the carboxyl group equivalent of the polyurethane resin (A) becomes 0.5 to 3.0. If the ratio of the epoxy equivalent is less than the lower limit of the above range, there sometimes occurs a disadvantage that electrical insulation property of a cured film composed of the thermosetting resin composition becomes insufficient or tack property is increased. On the other hand, if the ratio of the epoxy equivalent is more than the upper limit of the above range, shrinkage of a cured film is increased, and when the cured film is used as an insulating protective film of a flexible printed wiring board, low warpage property tends to be deteriorated.

Additive (D)

To the thermosetting composition of the invention may be added publicly known various additives, e.g., inorganic fillers, such as barium sulfate, talc, calcium carbonate, alumina, glass powder, quartz powder and silica; organic fillers, such as acrylic bead, urethane bead and silicone powder; fiber reinforcements, such as glass fiber, carbon fiber and boron nitride fiber; colorants such as titanium oxide, zinc oxide, carbon black, black iron oxide, organic pigment and organic dye; antioxidants, such as hindered phenol-based compounds, phosphorus-based compounds and hindered amine-based compounds; and ultraviolet light absorbers, such as benzotriazole-based compounds and benzophenone-based compounds. According to the purpose, viscosity modifier, thixotropic agent, flame retardant, bactericide, mildew-proofing agent, antistatic agent, plasticizer, lubricant, blowing agent, anti-foaming agent, coating film leveling agent, etc. may be further added.

Organic Solvent (E)

In the thermosetting composition of the invention, an organic solvent (E) that is inert to the functional group contained in the composition may be used in order to easily dissolve or disperse the polyurethane resin (A) and the curing accelerator (B) or in order to adjust the viscosity of the composition so as to be suitable for coating. The organic solvent (E) is removed in the drying step before curing or in the curing step.

Examples of the organic solvents (E) include toluene, xylene, ethylbenzene, nitrobenzene, cyclohexane, isophorone, diethylene glycol dimethyl ether, ethylene glycol diethyl ether, carbitol acetate, propylene glycol methyl ether acetate, propylene glycol ethyl ether acetate, dipropylene glycol methyl ether acetate, diethylene glycol ethyl ether acetate, methyl methoxypropionate, ethyl methoxypropionate, methyl ethoxypropionate, ethyl ethoxypropionate, ethyl acetate, n-butyl acetate, isoamyl acetate, ethyl lactate, acetone, methyl ethyl ketone, cyclohexanone, N,N-dimethylformamide, N,N-dimethylacetamide, N-methylpyrrolidone, γ-butyrolactone, dimethyl sulfoxide, chloroform, methyl chloride and petroleum naphtha. These may be used singly or may be used in combination of two or more kinds.

Process for Preparing Thermosetting Resin Composition

The thermosetting resin composition of the invention is obtained by mixing the polyurethane resin (A), the curing accelerator (B) and the curing agent (C), and if necessary, the additive (D) and the organic solvent (E) by the use of a mixing machine, such as disperser, kneader, three-roll mill or bead mill, to dissolve or disperse them.

Since the thermosetting resin composition of the invention prepared as above has a low curing rate at ordinary temperature after preparation, it has a long working life of not shorter than 12 hours, and a satisfactory pot life can be ensured. Further, a liquid obtained by dissolving or dispersing the polyurethane resin (A) and the curing accelerator (B), and if necessary, the additive (D) in the organic solvent (E), and the curing agent (C) are separately prepared, then they are separately stored, and they are mixed to prepare a thermosetting resin composition immediately before using, whereby the composition can take such a form as to be capable of being stored for a long period of time.

The solder resist ink referred to in the invention is an ink used for forming a solder resist and refers to a liquid matter.

The solder resist ink according to the invention contains the above-mentioned thermosetting resin composition. The solder resist ink according to the invention may contain only the thermosetting resin composition or may contain other components in addition to the thermosetting resin composition. The solder resist ink of the invention may be prepared by, for example, blending the components of the thermosetting resin composition and if necessary other components and then dissolving or dispersing them by the use of the aforesaid mixing machine, or may be prepared by preparing the thermosetting resin composition, then adding other components and mixing them homogeneously.

The cured product according to the invention is obtained by curing the thermosetting resin composition of the invention. The cured product according to the invention is utilized as, for example, a film such as a surface protective film for a wiring circuit.

When the cured product of the invention is used as such a film, the cured product is prepared by, for example, applying the thermosetting resin composition to a surface of an object of protection through screen printing or the like and heat curing the composition after drying or without drying. The heating conditions are usually a temperature of 100 to 160° C. and a time of 20 to 150 minutes. Thus, the thermosetting resin composition of the invention can prepare cured products at lower temperatures as compared with conventional thermosetting resin compositions, and the composition is excellent in low-temperature curability.

The insulating protective film referred to in the invention is a film for electrical insulation purpose, and is a film which is formed by applying the thermosetting resin composition onto an object of protection and heat curing the composition, or a film which is formed by heat curing the thermosetting resin composition without applying it onto an object of protection and which is laminated to the object.

The insulating protective film according to the invention comprises the cured product of the invention. As described above, the insulating protective film of the invention is prepared by applying the thermosetting resin composition to a surface of an object of protection and heat curing the composition or by heat curing the thermosetting resin composition in the form of a film without applying the composition to an object of protection.

The solder resist according to the invention comprises the cured product of the invention. The preparation process is the same as that for the insulating protective film. By using the solder resist ink, the solder resist can be also prepared in the same manner as above.

The printed wiring board referred to in the invention is a structure in which a metal wiring, such as copper wiring, is provided on a surface of a base, such as epoxy resin-glass (nonwoven) fabric composite base, epoxy resin-paper composite base, phenolic resin-paper composite base, BT resin-glass (nonwoven) fabric composite base, polyethylene terephthalate resin (PET) base, polyimide resin base, liquid crystal polymer base or glass base, and a substrate surface including the metal wiring is covered with the insulating protective film. The metal wiring is arranged on one or both surfaces of the base, and when the metal wiring is arranged on both surfaces of the base, the printed wiring board sometimes has a constitution wherein the wirings on both surfaces are partially connected to each other by way of a through-hole structure or the like. There are a case where the wiring is directly formed on the base and a case where the wiring is bonded to the substrate with an adhesive or the like. A printed wiring board having a so-called flying lead structure in which the base is partially removed and the wiring is present alone is also included in the concept of the printed wiring board of the invention. A printed wiring board in which a part or all of the wiring surface has been subjected to plating treatment such as gold plating or tin plating is also included in the concept of the printed wiring board of the invention.

The printed wiring board according to the invention has a substrate whose surface is provided with a metal wiring and the above-mentioned insulating protective film which covers a part or all of the substrate surface. The printed wiring board according to the invention is prepared by applying the thermosetting resin composition to a given area of the substrate through screen printing or the like and heat curing the composition after drying or without drying to form an insulating protective film. The heating conditions are the same as those in the case of the cured product.

The flexible printed wiring board referred to in the invention is a printed wiring board which is one of the above-mentioned printed wiring boards and whose substrate is flexible. Specifically, the flexible printed wiring board refers to a printed wiring board using a resin film base, such as a polyethylene terephthalate resin (PET) base, a polyimide resin base or a liquid crystal polymer base.

The flexible printed wiring board according to the invention has a substrate whose surface is provided with a metal wiring and the above-mentioned insulating protective film which covers a part or all of the substrate surface. The preparation process is the same as that for the printed wiring board.

The chip-on-film (COF) referred to in the invention is a kind of the flexible printed wiring board, and is a film of a structure in which a copper wiring is arranged on a surface of a resin film such as a polyimide resin and its surface is covered with an insulating protective film, and has a structure to mount a chip such as IC or LSI on the wiring board. Hence, the chip-on-film has a structure in which an insulating protective film is not provided on a portion of the wiring on which a chip such as IC or LSI is to be mounted and a portion of the wiring through which signals are input into the wiring board or from which signals are taken out.

The chip-on-film (COF) has a substrate whose surface is provided with a metal wiring and the above-mentioned insulating protective film which covers the substrate surface. The preparation process is the same as that for the printed wiring board.

A particularly effective mode of the chip-on-film (COF) of the invention is a chip-on-film which has a structure in which a polyimide resin is used as a base, on one surface of the base is arranged a copper wiring without using an adhesive or the like, a part or all of the surface layer of the copper wiring is covered with a tin plating layer, and in the area where a chip such as IC or LSI is to be mounted, a wiring is arranged on the polyimide resin base (this structure is not a flying lead structure), and which is used for circuit boards to mount driving driver IC (LSI) of flat panel displays, such as liquid crystal image planes of liquid crystal television, plasma television, liquid crystal monitor and personal computer.

Since the insulating protective film that is the cured product of the invention has high reliability of electrical insulation, the chip-on-film (COF) of the invention is a useful technique capable of meeting design of 30 µm pitch or 25 µm pitch introduction of which into chip-on-films (COF) in future is planned as previously described.

Further, since the insulating protective film that is the cured film of the invention has low warpage property, the chip-on-film (COF) of the invention is a useful technique capable of meeting a demand for low warpage property for enhancing such alignment accuracy as previously described in an image plane of liquid crystal or the like.

Furthermore, since the insulating protective film that is the cured film of the invention has low tack property, the chip-on-film (COF) of the invention is a useful technique capable of meeting a demand for tack-free property which is required in storing as previously described.

The thermosetting resin composition of the invention is excellent in low-temperature curability and is capable of meeting a demand for low-temperature curing at a temperature of not higher than 120° C., said low-temperature curing being required for preventing joining failure due to migration which occurs when curing is carried out at a temperature of not lower than 130° C. as previously described, and hence, the chip-on-film (COF) of the invention can be produced with maintaining a favorable tin plated state.

The electronic part according to the invention contains the cured product of the invention. Examples of the electronic parts include a liquid crystal panel module, a liquid crystal driver, an IC driver and a mother board for personal computer.

EXAMPLES

The present invention is further described with reference to the following examples, but it should be construed that the invention is in no way limited to those examples.

Synthesis Example 1

In a reaction vessel equipped with a stirring device, a thermometer and a condenser, 70.7 g of "C-1065N" (available from Kuraray Co., Ltd., polycarbonate diol, raw material diol molar ratio: 1,9-nonanediol:2-methyl-1,8-octanediol=65:35, molecular weight: 991) as the polyol compound (b), 13.5 g of 2,2-dimethylolbutanoic acid (available from Nippon Kasei Chemical Co., Ltd.) as the carboxyl group-containing dihydroxy compound (c) and 128.9 g of diethylene glycol ethyl ether acetate (available from Dicel Chemical Industries, Ltd.) as a solvent were placed, and they were heated to 90° C. to dissolve all of the raw materials. The temperature of the reaction solution was lowered down to 70° C., and 42.4 g of methylenebis(4-cyclohexyl isocyanate) ("Desmodur-W" available from Sumika Bayer Urethane Co., Ltd.) was dropwise added as the polyisocyanate compound (a) by a dropping funnel over a period of 30 minutes. After the dropwise addition was completed, reaction was carried out at 80° C. for 1 hour, then at 90° C. for 1 hour and at 100° C. for 2 hours, and after it was confirmed that isocyanate had nearly disappeared, 1.46 g of isobutanol (available from Wako Pure Chemical Industries, Ltd.) was dropwise added as the monohydroxy compound (d), followed by further reaction at 105° C. for 1.5 hours. The resulting resin (A) containing two or more carboxyl groups and having a polyurethane structure had a number-average molecular weight of 6,800 and a solid matter acid value of 39.9 mg-KOH/g.

Synthesis Example 2

In a reaction vessel equipped with a stirring device, a thermometer and a condenser, 95.3 g of "C-1065N" (available from Kuraray Co., Ltd., polycarbonate diol, raw material diol molar ratio: 1,9-nonanediol:2-methyl-1,8-octanediol=65:35, molecular weight: 991) as the polyol compound (b), 15.4 g of 2,2-dimethylolbutanoic acid (available from Nippon Kasei Chemical Co., Ltd.) as the carboxyl group-containing dihydroxy compound (c) and 145.5 g of diethylene glycol ethyl ether acetate (available from Dicel Chemical Industries, Ltd.) as a solvent were placed, and they were heated to 70° C. to dissolve all of the solid raw materials to obtain a solution. To the solution, 34.8 g of "T-80" (available from Mitsui Takeda Chemical Co., Ltd., mixture of 2,4-tolylene diisocyanate and 2,6-tolyene diisocyanate (80:20)) was dropwise added as the polyisocyanate compound (a) by a dropping funnel over a period of 10 minutes. After the dropwise addition was completed, reaction was carried out at 70° C. for 1 hour, then at 80° C. for 1 hour, then at 90° C. for 1 hour and at 100° C. for 1 hour, and after it was confirmed that isocyanate had nearly disappeared, 1.0 g of isobutanol (available from Wako Pure Chemical Industries, Ltd.) was dropwise added as the monohydroxy compound (d), followed by further reaction at 100° C. for 1 hour. The resulting resin (A) containing two or more carboxyl groups and having a polyurethane structure had a number-average molecular weight of 9.500 and a solid matter acid value of 40.0 mg-KOH/g.

Example 1

To the polyurethane resin (A) solution (solids concentration: 50% by mass) obtained in Synthesis Example 1 were added an epoxy resin (glycidyl amine type epoxy resin, "jER834" available from Japan Epoxy Resins Co., Ltd.) as the curing agent (C) in an amount of 17.4 parts by mass by which the ratio of the epoxy equivalent of the epoxy resin to the carboxyl group equivalent of the polyurethane resin would become 1.0, 5-diazabicyclo[4.3.0]nonene-5 (DBN, available from San-Apro Ltd.) as the curing accelerator (B) in an amount of 0.3 part by mass, barium sulfate ("BARIACE B-30" available from Sakai Chemical Industry Co., Ltd.) as an additive in an amount of 20 parts by mass and an amorphous silica powder ("Aerosil-380" available from Nippon Aerosil Co., Ltd.) in an amount of 4 parts by mass, each amount being based on 100 parts by mass of the polyurethane resin solid matter. Then, the composition in which these components had been blended was passed through a three-roll mill (manufactured by Kodaira Seisakusho Co., Ltd., model:

RIII-1RM-2) three times to mill the composition, whereby a thermosetting resin composition was prepared.

Example 2

A thermosetting resin composition was obtained in the same manner as in Example 1, except that as the curing accelerator, 1,8-diazabicycl[5.4.0]undecene-7(DBU, available from San-Apro Ltd.) was used instead of DBN.

Example 3

A thermosetting resin composition was obtained in the same manner as in Example 1, except that as the solution of the resin having a polyurethane structure, the solution of the resin having a polyurethane structure obtained in synthesis Example 2 was used instead of the solution of the resin having a polyurethane structure obtained in Synthesis Example 1.

Example 4

A thermosetting resin composition was obtained in the same manner as in Example 2, except that as the solution of the resin having a polyurethane structure, the solution of the resin having a polyurethane structure obtained in synthesis Example 2 was used instead of the solution of the resin having a polyurethane structure obtained in Synthesis Example 1.

Comparative Example 1

A thermosetting resin composition was obtained in the same manner as in Example 1, except that as the curing accelerator, 1 part by mass of 2-methylimidazole (pKa: 7.88, "Curezole 2MZ" available from Shikoku Chemicals Corporation, melting point: 143 to 148° C.) was used instead of DBN.

Comparative Example 2

A thermosetting resin composition was obtained in the same manner as in Example 1, except that as the curing accelerator, 1 part by mass of pyridine (pKa: 5.42, boiling point: 115° C.) was used instead of DBN.

Comparative Example 3

A thermosetting resin composition was obtained in the same manner as in Example 1, except that as the curing accelerator, 1 part by mass of melamine (pKa: 5.00) was used instead of DBN.

Comparative Example 4

A thermosetting resin composition was obtained in the same manner as in Example 3, except that as the curing accelerator, 1 part by mass of 2-methylimidazole (pKa: 7.9, "Curezole 2MZ" available from Shikoku Chemicals Corporation) was used instead of DBN.

Comparative Example 5

A thermosetting resin composition was obtained in the same manner as in Example 3, except that as the curing accelerator, 1 part by mass of pyridine was used instead of DBN.

Comparative Example 6

A thermosetting resin composition was obtained in the same manner as in Example 3, except that as the curing accelerator, 1 part by mass of melamine was used instead of DBN.

Comparative Example 7

A thermosetting resin composition was obtained in the same manner as in Comparative Example 1, except that the amount of 2-methylimidazole as the curing accelerator was increased to 3 parts by mass from 1 part by mass.

Comparative Example 8

A thermosetting resin composition was obtained in the same manner as in Comparative Example 3, except that the amount of melamine as the curing accelerator was increased to 3 parts by mass from 1 part by mass.

Evaluation

Using the thermosetting resin compositions obtained in Examples 1 to 4 and Comparative Examples 1 to 8, tack property, warpage property, curability, electrical insulation property and presence of a contaminant due to heating were evaluated in the following manner. The evaluation results are set forth in Table 1.

Tack Property

The thermosetting resin composition was applied to a polyimide film having a thickness of 38 μm (Kapton (trademark) 150EN, available from DuPont-Toray Co., Ltd.) by screen printing using a #250-mesh stainless steel plate and heat cured at 110° C. for 40 minutes or 120° C. for 60 minutes. On the resist surface of the resulting specimen was superposed the same polyimide film as above, then a load of 7.0 g/cm$^2$ was applied, and they were allowed to stand for 24 hours. Thereafter, the specimen and the polyimide film were peeled from each other, and the mode of peeling was evaluated by the following criteria.

A: There is neither noise nor resistance brought with peeling.

B: There are a little noise and a little resistance brought with peeling.

C: There are large noise and great resistance brought with peeling.

Warpage Property

The thermosetting resin composition was applied to a polyimide film having a thickness of 38 μm (Kapton (trademark) 150EN, available from DuPont-Toray Co., Ltd.) by screen printing using a #250-mesh stainless steel plate, then heat cured at 120° C. for 60 minutes and further heat cured at 150° C. for 2 hours. The resulting coating film was cut into a circle having a diameter of 5 cm, then the circular film was placed on a surface plate in such a manner that the coated surface looked upward, and the warpage height was evaluated by the following criteria. The film thickness after curing was about 12 μm.

A: The warpage height is less than 5 mm.

B: The warpage height is not less than 5 mm.

Curability

The thermosetting resin composition was applied to a polyimide film having a thickness of 38 μm (Kapton (trademark) 150EN, available from DuPont-Toray Co., Ltd.) by screen printing using a #250-mesh stainless steel plate and heat cured at 110° C. for 40 minutes or 120° C. for 20 minutes. The resulting specimen was rubbed back and forth about 10 times with a cotton bud having been wetted with acetone, and the coating film thus rubbed was evaluated by the following criteria.

A: There is no scratch mark on the coating film.
B: There are some scratch marks on the coating film.
C: There is a scratch mark which is formed by dissolution of the coating film and reaches the polyimide film.

Electrical Insulation Reliability

Onto a substrate with a comb-shaped pattern of 30 μm pitch, the thermosetting resin composition was applied by screen printing using a #250-mesh stainless steel plate, and the composition was heat cured at 120° C. for 1 hour and further heat cured at 150° C. for 2 hours to prepare a specimen. To the substrate was applied a bias voltage of 60V DC in an atmosphere of 120° C. and a relative humidity of 85%, then the substrate was allowed to stand for 200 hours, and the electrical insulation property was evaluated by the following criteria.

A: Neither migration nor lowering of an insulation resistance value occurs.
B: Migration or lowering of an insulation resistance value occurs in 100 to 200 hours.
C: Migration or lowering of an insulation resistance value occurs in 50 to 100 hours.
D: Migration or lowering of an insulation resistance value occurs in not longer than 50 hours.

Presence of Contaminant Due to Heating

The thermosetting resin composition was applied to a polyimide film having a thickness of 38 μm (Kapton (trademark) 150EN, available from DuPont-Toray Co., Ltd.) by screen printing using a #250-mesh stainless steel plate and heat cured at 120° C. for 60 minutes. The resulting coating film was held on a hot plate heated at 180° C. in such a manner that the coated surface looked upward, and the coating film was covered with a transparent lidded glass container (Petri dish), followed by heating at 180° C. for 4 hours. The gas generated from the coating film by outgassing was trapped by the inner surface of the glass container, and presence of a contaminant having adhered to the container was observed.

The invention claimed is:

1. A thermosetting resin composition comprising:
   a resin (A) containing two or more carboxyl groups and having a polyurethane structure,
   a strongly basic nitrogen-containing heterocyclic compound having pKa of 10.0 to 14.0, as a curing accelerator (B), and
   a curing agent (C) which is a compound having an epoxy group which reacts with a carboxyl group,
   wherein the resin (A) containing two or more carboxyl groups and having a polyurethane structure is obtained by allowing a polyisocyanate compound (a), a polyol compound (b), a carboxyl group-containing dihydroxy compound (c), and a monohydroxy compound (d) and/or a monoisocyanate compound (e) to react with one another,
   wherein the monohydroxy compound (d) and the monoisocyanate compound (e) are end cappers, and
   wherein the polyol compound (b) and the carboxyl group-containing dihydroxy compound (c) are not the same.

2. The thermosetting resin composition as claimed in claim 1, wherein the curing accelerator (B) is a compound which has a boiling point of not lower than 100° C. and is liquid at 20° C.

3. The thermosetting resin composition as claimed in claim 1, wherein the curing accelerator (B) is 1,8-diazabicyclo[5.4.0]undecene-7 and/or 5-diazabicyclo[4.3.0]nonene-5.

4. A solder resist ink containing the thermosetting resin composition as claimed in claim 1.

5. A cured product obtained by curing the thermosetting resin composition as claimed in claim 1.

6. An insulating protective film comprising the cured product as claimed in claim 5.

7. A solder resist comprising the cured product as claimed in claim 5.

8. A printed wiring board having a substrate whose surface is provided with a metal wiring and the insulating protective film as claimed in claim 6 which covers a part or all of the substrate surface.

9. A flexible printed wiring board having a substrate whose surface is provided with a metal wiring and the insulating protective film as claimed in claim 6 which covers a part or all of the substrate surface.

10. A chip-on-film (COF) having a substrate whose surface is provided with a metal wiring and the insulating protective film as claimed in claim 6 which covers the substrate surface.

11. An electronic part containing the cured product as claimed in claim 5.

TABLE 1

| | Curing accelerator | pKa | Resin | Tack property 110° C., 40 min | Tack property 120° C., 60 min | Warpage property | Curability 110° C., 40 min | Curability 120° C., 20 min | Electrical insulation property | Presence of contaminant due to heating |
|---|---|---|---|---|---|---|---|---|---|---|
| Ex. 1 | DBN | 12.5 | Synthesis Example 1 | A | A | A(4.3 mm) | A | A | A | no |
| Ex. 2 | DBU | 12.5 | Synthesis Example 1 | B | A | A(4.0 mm) | B | A | A | no |
| Ex. 3 | DBN | 12.7 | Synthesis Example 2 | A | A | A(4.5 mm) | A | A | A | no |
| Ex. 4 | DBU | 12.7 | Synthesis Example 2 | A | A | A(4.3 mm) | B | A | A | no |
| Comp. Ex. 1 | Curazole 2MZ | 7.9 | Synthesis Example 1 | C | B | A(3.5 mm) | C | C | C | yes |
| Comp. Ex. 2 | pyridine | 5.4 | Synthesis Example 1 | C | C | A(3.3 mm) | C | C | C | no |
| Comp. Ex. 3 | melamine | 5.0 | Synthesis Example 1 | C | B | A(4.3 mm) | B | B | A | yes |
| Comp. Ex. 4 | Curazole 2MZ | 7.9 | Synthesis Example 2 | C | B | A(3.8 mm) | C | C | D | yes |
| Comp. Ex. 5 | pyridine | 5.4 | Synthesis Example 2 | C | B | A(3.3 mm) | C | C | C | no |
| Comp. Ex. 6 | melamine | 5.0 | Synthesis Example 2 | B | B | A(4.0 mm) | B | B | A | yes |
| Comp. Ex. 7 | Curazole 2MZ | 7.9 | Synthesis Example 1 | B | A | B(5.5 mm) | B | A | D | yes |
| Comp. Ex. 8 | melamine | 5.0 | Synthesis Example 1 | B | A | B(6.0 mm) | A | A | B | yes |

* * * * *